AMPLITUDE DETECTOR HAVING A TUNNEL DIODE LINEARITY COMPENSATING CIRCUIT

Filed Oct. 4, 1966

INVENTOR
S. P. HOFFMAN
BY S. Gundersen
ATTORNEY

United States Patent Office 3,466,556
Patented Sept. 9, 1969

3,466,556

AMPLITUDE DETECTOR HAVING A TUNNEL DIODE LINEARITY COMPENSATING CIRCUIT

Sellers P. Hoffman, Burlington, N.C., assignor to Western Electric Company Incorporated, New York, N.Y., a corporation of New York Filed Oct. 4, 1966, Ser. No. 584,147
Int. Cl. H03d 1/10
U.S. Cl. 329—205 6 Claims

ABSTRACT OF THE DISCLOSURE

A tunnel diode circuit including (1) a first parallel combination including an inductor in a first resistor and (2) a second parallel combination including a tunnel diode and a second resistor, is connected across the input of a rectifying junction in a detector circuit. The tunnel diode circuit produces an effective gain at low signal magnitudes to compensate for non-linearity of the rectifying junction. The impedance of the tunnel diode circuit is much less than the shunt capacitance impedance of the detector circuit and therefore provides a wide bandpass at high frequencies.

This invention relates to linear amplitude detectors and more particularly to a circuit for improving both the linearity of the output amplitude with respect to the input amplitude and the bandpass of diode detectors.

In the operation of certain communication systems, it is desirable to accurately detect the amplitude of radio frequency signals occupying a wide frequency spectrum. Diode envelope detectors are commonly used to detect the amplitude of radio frequency signals, but the ordinary diode detector is linear for only small amplitude ranges due to the nonlinearity of the diode voltage characteristic for large amplitude ranges. Heretofore, the amplitude linearity range of a diode detector has been extended by using the diode as substantially the sole effective load of an amplifier. For small signals, the increase in the diode resistance causes an increase in the effective gain of the amplifier to compensate for the nonlinearity. To compensate for shunt capacitance of the amplifier, the amplifier is tuned to the signal carrier frequency by inductor coupling. This is sufficient if the signal has a narrow bandwidth. However, such a detector is not sufficiently linear for low amplitude, high frequency pulses used in communication systems since they occupy wide frequency spectrums.

An object of the present invention is a new and improved linear envelope detector having a wide bandpass at high frequencies.

With this and other objects in view, the present invention contemplates a tunnel diode circuit connected in parallel with a diode detecting circuit. An input signal is applied across the parallel circuits. A tunnel diode in the tunnel diode circuit produces an effective gain at low signal magnitudes to compensate for the nonlinearity of the diode detector. The impedance of the tunnel diode circuit is much less than the shunt capacitive impedance of the detector circuit and therefore provides a wide bandpass at high frequencies.

The invention may be better understood by reference to the following detailed description when considered in conjunction with the accompanying drawings, wherein.

Figure 1:
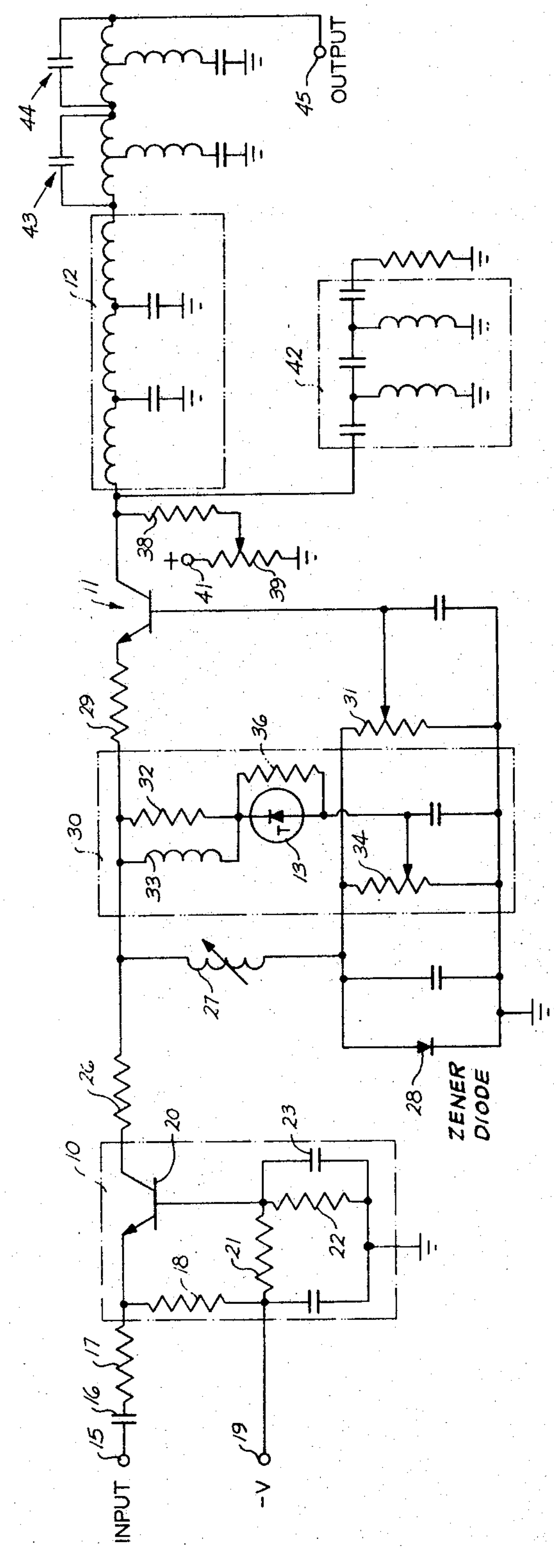
FIG. 1 is a diagram of the preferred diode detector circuit.

Referring first to FIG. 1, there is shown a linear detector circuit for detecting the amplitude of a broad bandwidth amplitude-modulated high frequency signal. The signal applied to an input 15 is amplified by a transistor amplifier 10. The amplified signal is applied across a tunnel diode circuit 30 and a class B biased emitter-base junction of a transistor 11. The tunnel diode circuit 30, in conjunction with an inductor 27, operates as a low impedance load to the amplifier 10 to substantially increase the band pass of the detector. A tunnel diode 13 in the circuit 30 is biased to produce a substantial gain for small amplitude signals to compensate for the voltage-current nonlinearity of the emitter-base junction of the transistor 11. A half-wave rectified signal containing the desired signal is produced on the collector of the transistor 11. The signal from the collector of the transistor 11 passes through a low pass filter 12 which eliminates the carrier frequency and passes only the modulation signal to the output 45.

The amplifier 10 is shown as a grounded base transistor amplifier biased in its active state. The input 15 is coupled to the emitter of a transistor 20 by a capacitor 16 and a resistor 17. A bias potential is applied to the emitter of the transistor 20 by a resistor 18 connected to a voltage source 19. A voltage divider network comprising the resistors 21 and 22 connected across the voltage source 19 supplies a bias to the base of the transistor 20. Alternating signals on the base of the transistor 20 are grounded through the capacitor 23. Potential is applied to the collector of the transistor 20 through a resistor 26 and an inductor 27 from a Zener diode 28 which establishes a reference voltage from the current through the circuit just described. Inductor 27 is tuned with the total circuit capacitance at the input signal frequency.

Figure 2:
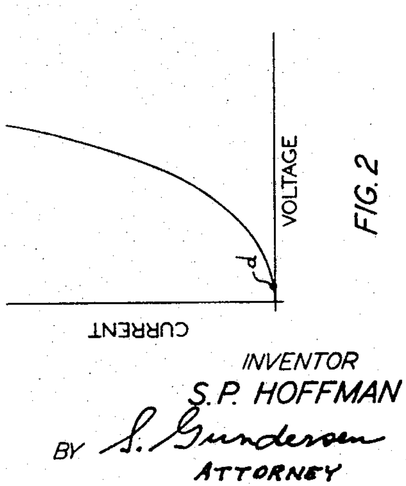
FIG. 2 is a curve showing the voltage-current characteristics of an ordinary diode.

The output of the amplifier 10 is applied through a resistor 29 to the emitter of the transistor 11 to rectify the input signal. A potentiometer 31 supplies an adjustable voltage to the base of the transistor 11 to bias the emitter-base junction at a point where negative half cycles of the input signal produce current through the emitter-base junction and positive half cycle of the input signal produce substantially no current through the emitter-base junction. This point is shown as point *d* on FIG. 2. The collector of transistor 11 is biased through a resistor 38 from a potentiometer 39 connected to a voltage source 41. Only negative half cycles of the signal from the transistor 20 effect operation of the transistor 11 to produce a half-wave rectified signal on the collector of the transistor 11. This half-wave rectified signal contains a separable component which represents the amplitude of the input signal.

A tunnel diode circuit 30 is connected in parallel with the emitter-base junction of the transistor 11 to produce a wide bandpass and to compensate for the inherent nonlinearity of the emitter-base junction. The tunnel diode 13 and parallel resistor 36 are serially connected with the parallel combination of a resistor 32 and an inductor 33 across the input of the transistor 11. Bias is applied to the tunnel diode 13 from a potentiometer 34 connected across the Zener diode 28 and through the inductor 33. The resistor 36 is connected across the tunnel diode to stabilize its operation in its negative resistance state. The resistor 32 prevents overloading the tunnel diode 13 when a large amplitude signal is applied.

Figure 3:
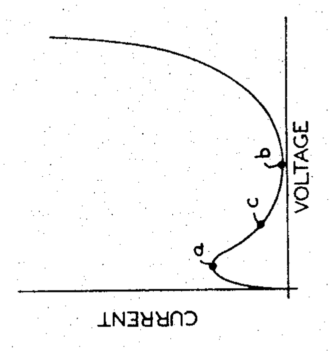
FIG. 3 is a curve showing the voltage-current characteristics of a tunnel diode.

As shown in the curve of FIG. 3, the tunnel diode characteristic has a negative resistance from point *a* to point *b*; that is, an increase in the voltage applied across the tunnel diode terminals results in a decrease in the current through the tunnel diode. The bias supplied from the potentiometer 34 and through the inductor 33 is such that the tunnel diode is biased at point *c* within this negative resistance region. For small signals, the tunnel diode 13 operates between points *a* and *b* and a voltage gain is produced across the emitter-base junction of the transistor 11. As the instantaneous voltage from the amplifier 10 increases, the voltage across the tunnel diode increases from point *c* to *b*; the current through the diode 13 decreases which results in an increase or gain in the current through the emitter-base junction of the transistor 11. As larger signals are applied across the tunnel diode 13, the diode 13 acts as a low impedance resulting in a current loss through the tunnel diode 13 which reduces the gain of the transistor amplifier 10 at large signal values. The combination of the amplification of low signal values and loss at high signal values compensates for the nonlinear characteristics of the emitter-base junction of the transistor 11. The total resistive impedance of the tunnel diode circuit 30 is small when compared with the shunt capacitive impedance of the transistor 20, and therefore, the shunt capacitive impedance does not adversely affect the gain of the amplifier for a broad bandwidth signal.

The output of the transistor 11 is applied to a low pass filter 12 and a high pass filter 42 to eliminate the carrier frequency and pass only the modulation component of the signal to the output 45. The combination of the high pass filter 42 and the low pass filter 12 produces a resistive load for the transistor 11 for all frequencies. Equalizer networks 43 and 44 couple the output of the filter 12 to the output terminal 45.

Figure 4:
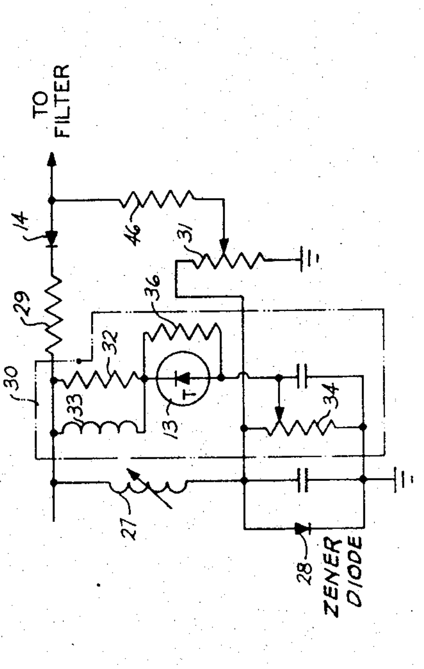
FIG. 4 is a diagram of the rectifying portion of an alternative diode detector.

Referring now to FIG. 4, there is shown an alternate rectifying section which may be used in place of the transistor rectifying section of FIG. 1. A class B biased diode 14 and resistor 46 replace the transistor 11. The diode 14 operates in the same manner as the emitter-base junction of the transistor 11 and produces a half-wave rectified signal across the resistor 46. This half-wave rectified signal has a component which represents the amplitude of the input signal and is passed by the filter 12 to the output terminal 45.

What is claimed is:

1. A linear amplitude detector comprising:

a rectifying diode having an inherent nonlinear voltage-current characteristic;

means for biasing the rectifying diode such that one polarity half cycles of an input signal to the detector produce current through the diode and half cycles of the input signal having a polarity opposite to the one polarity produce substantially no current through the diode;

a tunnel diode circuit including (1) a first parallel combination including an inductor and a first resistor, and (2) a second parallel combination including a tunnel diode and a second resistor, said first and second parallel combinations being connected in series across the input of the rectifying diode;

means for biasing the tunnel diode for stable operation in its negative resistance region to compensate for the nonlinearity of the diode junction;

means for applying the input signal to the input of the rectifying diode and across the tunnel diode circuit; and means connected to the rectifying diode for separating the modulation component of the signal from the carrier component of the signal.

2. A linear amplitude detector as defined in claim 1 wherein:

the signal applying means comprises an amplifier having (1) input means for connection to a source of input signals, and (2) output means connected to the rectifying diode and the tunnel diode circuit with the rectifying diode and the tunnel diode circuit comprising essentially the sole effective load of the amplifier.

3. A linear amplitude detector as defined in claim 2 wherein:

the amplifier includes a grounded base transistor having an emitter, a base, and a collector with (1) the input means connected across the emitter and base of the grounded base transistor, and (2) the output means connected across the collector and base of the grounded base transistor.

4. A linear amplitude detector comprising:

a transistor having an emitter, a base, and a collector;

means for biasing the transistor such that one polarity half cycles of an input signal to the detector produce current through the emitter-base junction and half cycles of the input signal having a polarity opposite to the one polarity produce substantially no current through the emitter-base junction;

a tunnel diode circuit including (1) a first parallel combination including an inductor and a first resistor and (2) a second parallel combination including a tunnel diode and a second resistor, said first and second parallel combinations being connected in series across the emitter base junction of the transistor;

means for biasing the tunnel diode for stable operation in its negative resistance state to compensate for the nonlinearity of the emitter-base junction;

means for applying the input signal to the emitter-base junction and the tunnel diode circuit; and means connected across the collector and base of the transistor for filtering the modulation component of the signal from the carrier component of the signal.

5. A linear amplitude detector as defined in claim 4 wherein:

the signal applying means comprises an amplifier having (1) input means for connection to a source of input signals, and (2) output means connected to the emitter-base junction and the tunnel diode circuit with the emitter-base junction and the tunnel diode circuit comprising essentially the sole effective load for the amplifier.

6. A linear amplitude detector as defined in claim 5 wherein:

the amplifier includes a grounded base transistor having an emitter, a base, and a collector with (1) the input means connected across the emitter and base of the grounded base transistor, and (2) the output means connected across the collector and base of the grounded base transistor.

References Cited

UNITED STATES PATENTS

| | | | |
|---|---|---|---|
| 3,061,790 | 10/1962 | Theriault | 307—322 X |
| 3,206,690 | 9/1965 | Watters et al. | |
| 3,214,608 | 10/1965 | Mollinga | 307—235 |
| 3,281,610 | 10/1966 | Barbier et al. | 307—322 X |

ALFRED L. BRODY, Primary Examiner

U.S. Cl. X.R.

307—322; 235; 325—451; 329—105, 149